United States Patent
Yuan et al.

(10) Patent No.: US 11,342,716 B2
(45) Date of Patent: May 24, 2022

(54) SHIELDING NET AND CONNECTOR USING SAME

(71) Applicant: AVIC JONHON OPTRONIC TECHNOLOGY CO., LTD., Luoyangshi (CN)

(72) Inventors: Junfeng Yuan, Luoyangshi (CN); Lufei Ma, Luoyangshi (CN); Zongwei Li, Luoyangshi (CN)

(73) Assignee: AVIC JONHON OPTRONIC TECHNOLOGY CO., LTD., Luoyangshi (CN)

( * ) Notice: Subject to any disclaimer, the term of this patent is extended or adjusted under 35 U.S.C. 154(b) by 0 days.

(21) Appl. No.: 17/044,544

(22) PCT Filed: Jul. 24, 2019

(86) PCT No.: PCT/CN2019/097411
§ 371 (c)(1),
(2) Date: Oct. 1, 2020

(87) PCT Pub. No.: WO2020/020198
PCT Pub. Date: Jan. 30, 2020

(65) Prior Publication Data
US 2021/0119388 A1 Apr. 22, 2021

(30) Foreign Application Priority Data

Jul. 27, 2018 (CN) .......................... 201821206722.2

(51) Int. Cl.
*H01R 43/24* (2006.01)
*H01R 13/6591* (2011.01)
(Continued)

(52) U.S. Cl.
CPC ..... *H01R 13/6591* (2013.01); *H01R 13/6585* (2013.01); *H01R 43/24* (2013.01); *H05K 9/00* (2013.01)

(58) Field of Classification Search
CPC ............ H01R 13/6582; H01R 13/6585; H01R 24/62; H01R 12/724; H01R 13/6581
See application file for complete search history.

(56) References Cited

U.S. PATENT DOCUMENTS 5,564,930 A * 10/1996 Yu ........................... G06F 1/181
361/679.41
5,959,244 A * 9/1999 Mayer .................. H05K 9/0018
174/369
(Continued)

FOREIGN PATENT DOCUMENTS

CN 102570105 A 7/2012
CN 104348011 A 2/2015
(Continued)

OTHER PUBLICATIONS

International Search Report issued in corresponding International Application No. PCT/CN2019/097411, dated Sep. 30, 2019; 5 pgs.
(Continued)

*Primary Examiner* — Truc T Nguyen
(74) *Attorney, Agent, or Firm* — Hauptman Ham, LLP

(57) ABSTRACT

A connector includes a housing. The housing includes a plurality of module channels therein and shielding net. A signal transmission module is movably mounted in each of the module channels. The signal transmission module includes an insulator and a signal contact member. The shielding net has a plurality of mesh holes. The signal transmission module includes a shielding ring sleeve segment. A shielding contact is conductively bonded to the shielding ring sleeve segment of a corresponding signal transmission module is respectively provided at each mesh (Continued)

hole of the shielding net. The shielding contact protrudes towards the center of the corresponding mesh hole. A plurality of the shielding contacts corresponding to each mesh hole are circumferentially disposed along the corresponding mesh hole. A shielding elastic sheet is conductively bonded to a shielding ring sleeve on each of the signal transmission modules.

9 Claims, 4 Drawing Sheets

(51) Int. Cl.
*H01R 13/6585* (2011.01)
*H05K 9/00* (2006.01)

(56) References Cited

U.S. PATENT DOCUMENTS

| | | | | |
|---|---|---|---|---|
| 6,115,263 A * | 9/2000 | Babineau | ............ | H05K 9/0016 174/382 |
| 6,206,728 B1 * | 3/2001 | Krehbiel | ............ | H05K 9/0018 439/939 |
| 6,206,730 B1 * | 3/2001 | Avery | ............ | H01R 13/6582 439/607.18 |
| 6,252,160 B1 * | 6/2001 | Chang | ............ | H05K 9/0016 174/377 |
| 6,359,768 B1 * | 3/2002 | Eversley | ............ | H05K 9/0016 439/497 |
| 6,607,308 B2 * | 8/2003 | Dair | ............ | G02B 6/4277 385/92 |
| 6,641,438 B1 * | 11/2003 | Billman | ............ | H01R 13/6582 439/95 |
| 7,583,510 B2 * | 9/2009 | Wang | ............ | H01R 13/658 174/362 |
| 9,035,199 B2 * | 5/2015 | Janota | ............ | H05K 9/002 174/385 |
| 2013/0017723 A1 | 1/2013 | Davis et al. | | |
| 2015/0064968 A1 | 3/2015 | Davis et al. | | |
| 2021/0045194 A1 * | 2/2021 | Hort | ............ | H05B 1/0294 |
| 2021/0322083 A1 * | 10/2021 | Wolf | ............ | A61B 18/1206 |

FOREIGN PATENT DOCUMENTS

| | | |
|---|---|---|
| CN | 105449464 A | 3/2016 |
| CN | 208675677 U | 3/2019 |

OTHER PUBLICATIONS

Written Opinion issued in corresponding International Application No. PCT/CN2019/097411, dated Sep. 30, 2019; 5 pgs.

* cited by examiner

SHIELDING NET AND CONNECTOR USING SAME

RELATED APPLICATIONS

The present application is a National Phase of International Application Number PCT/CN2019/097411 filed Jul. 24, 2019 and claims priority to Chinese Application Number 201821206722.2 filed Jul. 27, 2018.

TECHNICAL FIELD

The present utility model relates to a shielding net and a connector using the shielding net.

BACKGROUND ART

An electrical connector assembly realizes electrical conduction and corresponding signal transmission usually by plugging a socket with a plug connector, especially in the field of signal transmission. In most cases, it is necessary to configure a plurality of signal conductors of the same type to transmit signals, and the difference between the signal conductors mainly lies in the specific arrangement positions thereof. If connectors are respectively manufactured according to different requirements, cost is relatively high and universality is relatively poor. The modular connector assembly disclosed in the patent application publication No. CN104348011A can be used for solving the problem of poor universality. In the modular connector assembly, a plurality of individual chambers separated by chamber walls are provided on a housing, contact assemblies are provided in corresponding chambers, each contact assembly has a dielectric body holding a signal differential pair, each contact assembly has a grounding shielding member to provide corresponding electrical shielding for the differential pair, and the grounding shielding member has a C-shaped structure. In use of the connector assembly, according to requirements, different quantities of the contact assemblies can be selected and the contact assemblies can be filled at different positions to correspond to different application scenarios, and only the housing needs to be replaced. Furthermore, when the described connector structure is applied in a case where high-speed and high-quality signal transmissions are required, the grounding shielding member is C-shaped so as to provide corresponding electromagnetic shielding, thus preventing an electromagnetic field for signal transmission from leaking out.

In order to ensure the quality of signals, a shielding net is usually provided in the connector. For example, in an electrical connector having a grounding lattice disclosed in the patent application publication No. CN105449464A, the grounding lattice is provided on a connector housing, the grounding lattice comprises a support frame, the support frame has a plurality of lattices, each lattice is respectively provided with a lattice spring, and when the grounding shielding member of a corresponding contact assembly is inserted into a contact passage of the connector housing, the lattice spring is engaged with the grounding shielding member of the contact assembly to realize grounding conduction of all contact modules. However, because for the convenient assembly of general signal transmission modules, in the case that the shielding function is satisfied, the shielding member may be designed to be C-shaped so as to be convenient to fit into a signal portion; accordingly, the lattice springs on the grounding lattice are also in a three-sided semi-surrounding design and do not form a fully surrounding structure. The semi-surrounding design can meet the requirements of signal transmission modules completely fixed in the connector housing, but in a vibration and large deviation scenario requiring the signal transmission module to be movably assembled in the housing, the signal transmission modules may deviate toward one side where a grounding shielding portion is not provided, so that the corresponding sides where the grounding shielding portion is provided cannot effectively contact with the grounding lattice, thereby reducing the grounding shielding effect.

Summary of the Utility Model

The object of the present utility model is to provide a connector, so as to solve the technical problem in the prior art that a signal transmission module and a corresponding grounding lattice having semi-surrounding grounding shielding members cannot effectively ensure a grounding shielding effect when the signal transmission module is movably assembled; at the same time, the present utility model further provides a corresponding shielding net.

In order to achieve the above object, the technical solution of the connector provided by the present utility model is: a connector, comprising a housing, wherein the housing is provided therein with a plurality of module channels arranged in sequence, a signal transmission module is movably assembled in each module channel in a direction perpendicular to the module channel, the signal transmission module comprises an insulator and a signal contact member arranged in the insulator, the housing is further provided with a shielding net, the shielding net has a plurality of mesh holes corresponding to various module channels to allow the corresponding signal transmission modules to pass through, the signal transmission module has a shielding ring sleeve segment arranged at a position corresponding to a corresponding mesh hole and sheathed outside the insulator, a shielding contact conductively bonded to the shielding ring sleeve segment of a corresponding signal transmission module is respectively provided at each mesh hole of the shielding net, the shielding contact protrudes towards the center of the corresponding mesh hole, and a plurality of the shielding contacts corresponding to each mesh hole are circumferentially disposed along the corresponding mesh hole so as to form a fully surrounding arrangement.

The beneficial effects of the present utility model are as follows: in the connector provided by the present utility model, the signal transmission modules are movably assembled in corresponding module channels in the direction perpendicular to the module channels, and because the shielding contacts arranged corresponding to each mesh hole on the shielding net are in a plurality of fully surrounding arrangements in the circumferential direction of the mesh hole, there is a corresponding shielding elastic sheet conductively bonded to a shielding ring sleeve on each of the signal transmission modules regardless of the direction in which the signal transmission modules deviate, thereby effectively ensuring a grounding shielding effect of the shielding net for each signal transmission module.

Further, the shielding contact is a shielding elastic sheet, and each of the shielding elastic sheets corresponding to each mesh hole comprises a first elastic sheet bent toward one side of the shielding net and a second elastic sheet bent toward the other side of the shielding net.

Further, the shielding contact is a shaped protrusion integrally formed with the shielding net.

Further, each of the module channels has a channel port for the signal contact member of a corresponding signal transmission module to extend, a baffle for blocking the signal transmission modules from disengagement is provided in the housing at the position corresponding to the channel ports, and the shielding net is located between the baffle and the various module channels. The baffle is used to block the signal transmission modules to prevent same from disengagement. In addition, the shielding net is located between the baffle and the various corresponding module channels, and the baffle can also correspondingly block the shielding net.

The technical solution of the shielding net provided by the present utility model is: a shielding net, comprising a shielding net body, wherein the shielding net body has a plurality of mesh holes for allowing corresponding signal transmission modules to pass through, a shielding contact for being conductively bonded to the grounding shielding member of a corresponding signal transmission module is respectively provided at each mesh hole of the shielding net body, the shielding contact protrudes towards the center of the corresponding mesh hole, and a plurality of the shielding contacts corresponding to each mesh hole are circumferentially disposed along the corresponding mesh hole so as to form a fully surrounding arrangement.

Further, the shielding contact is a shielding elastic sheet. By using an elastic force provided by the shielding elastic sheet, contact shielding effect is improved.

Further, each of the shielding elastic sheets corresponding to each mesh hole comprises a first elastic sheet bent toward one side of the shielding net body and a second elastic sheet bent toward the other side of the shielding net body. The first elastic sheet and the second elastic sheet are arranged in separate directions, so that the elastic sheets are not too densely arranged in one direction, and on the other hand, the force applied to the signal transmission modules by the shielding elastic sheets can be relatively balanced.

Further, the shielding contact is a shaped protrusion integrally formed with the shielding net body. Manufacturing and formation are facilitated by using the shaped protrusion, and structure is simple.

Further, the mesh hole is rectangular, and four sides of the rectangular mesh hole are each provided with the shielding elastic sheet. The shielding elastic sheets are arranged on the four sides, thus effectively realizing the full surrounding design and facilitating manufacturing.

Further, the shielding net is a shielding member formed by stamping a metal strip material or a shielding member formed by injection molding a conductive plastic or a shielding member formed by injection molding a conductive rubber. The stamping or injection molding is convenient, and cost is relatively low.

DESCRIPTION OF EMBODIMENTS

Figure 1:
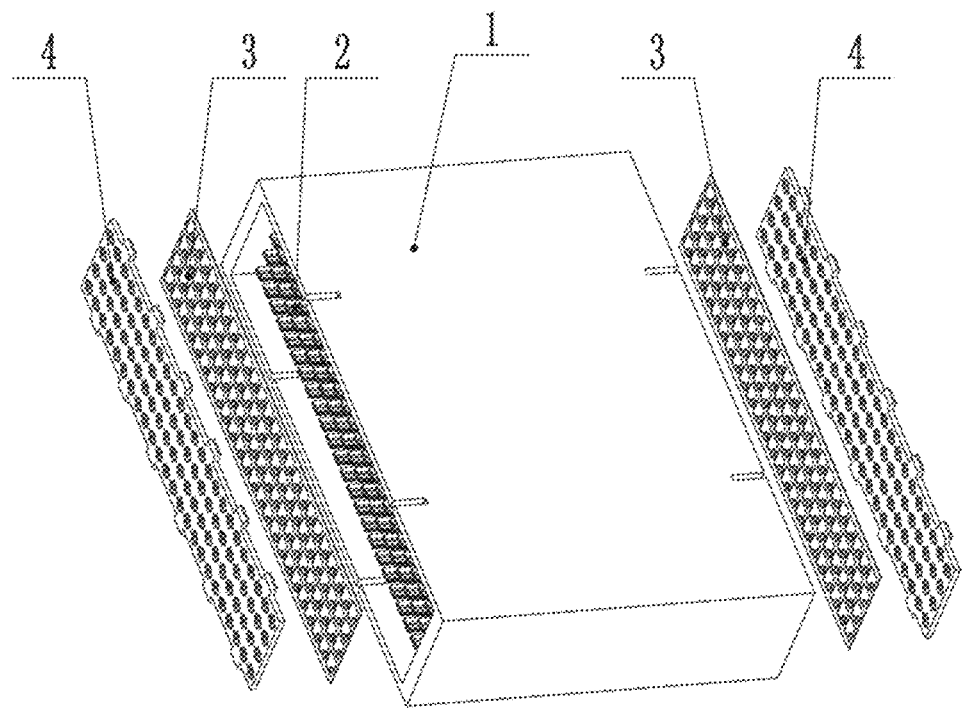
FIG. 1 is a schematic structural view of an embodiment of a connector provided by the present utility model.
Figure 2:
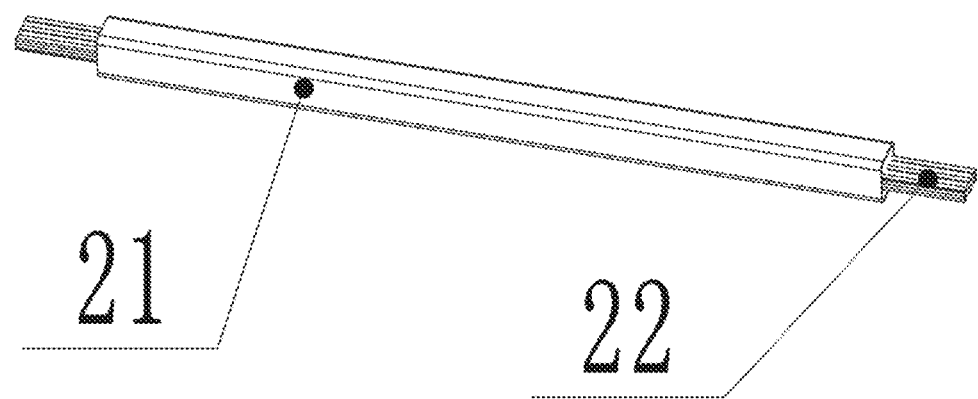
FIG. 2 is a schematic structural view of the signal transmission module in FIG. 1.

The embodiments of the present utility model are further described below with reference to the accompanying drawings, but are not limited thereto.

Embodiments of the connector provided by the present utility model:

as shown in FIG. 1 to FIG. 4, the connector in this embodiment comprises a housing 1, the housing 1 is an insulating housing usually formed by injection molding of plastic or the like, a plurality of module channels arranged in sequence are provided in the housing 1 and can be formed once in the injection molding process, a signal transmission module 2 is provided in each of the module channels, and if the extending direction of the module channels is defined as Z-direction, movable modules are movably assembled in the module channels in a direction perpendicular to the Z-direction, i.e., movable in XY-plane. The described signal transmission module 2 specifically comprises an insulator, a signal contact member 22 is provided on the insulator, a shielding ring sleeve 21 is sheathed outside the insulator, and said shielding ring sleeve herein is in a fully surrounding design.

During assembly, the signal transmission modules 2 are correspondingly sleeved in the module channels. In order to prevent the signal transmission modules from disengagement from the module channels, a baffle 4 is correspondingly provided in the housing 1; the baffle is designed as a fastening structure, i.e. a corresponding clip is provided on the baffle; and correspondingly, a bayonet is preconfigured on the housing. During assembly, the baffle is assembled on the housing by fitting the clip with the bayonet. Specifically, each module channel is provide with a channel port through which the signal contact member of a corresponding signal transmission module extends, and the baffle 4 is arranged at a position corresponding to the channel ports, so as to prevent the signal transmission modules from disengagement.

Figure 3:
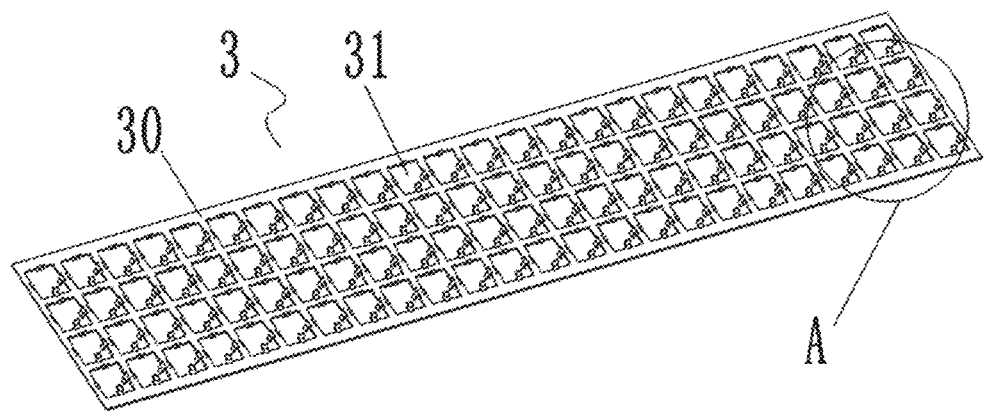
FIG. 3 is a schematic structural view of the shielding net in FIG. 1.
Figure 4:
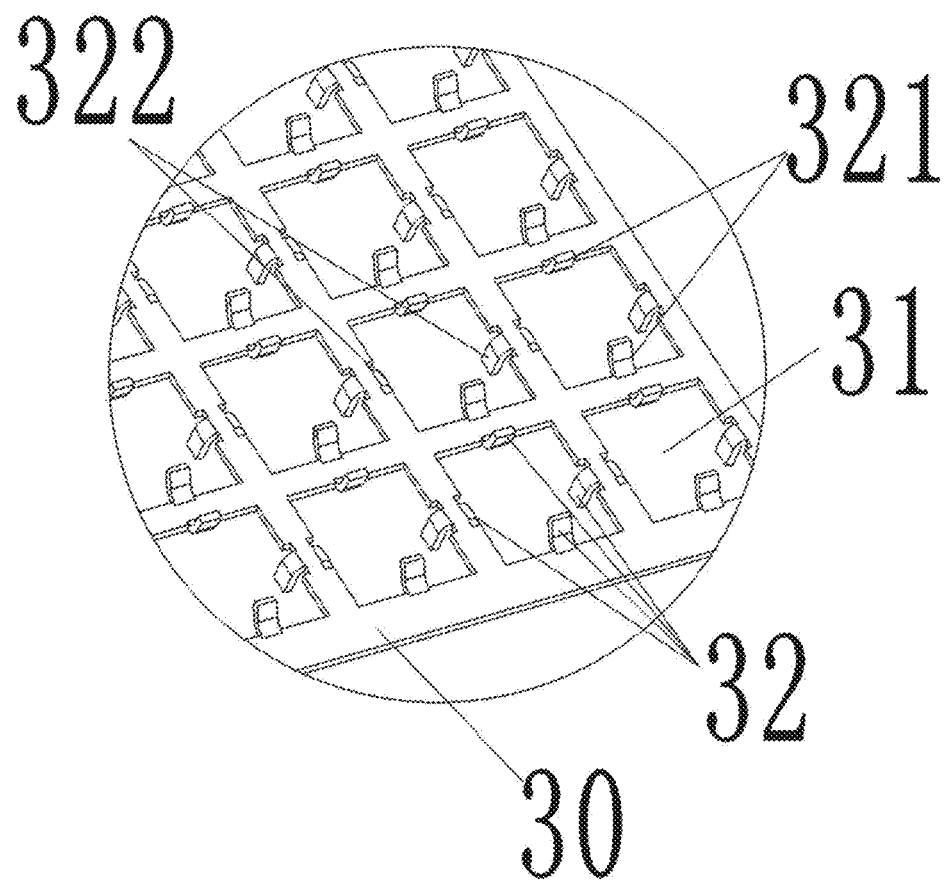
FIG. 4 is an enlarged view at A in FIG. 3.

In the housing 1, a shielding net 3 is provided between the baffle 4 and the various module channels. As shown in FIGS. 3 and 4, the shielding net 3 comprises a shielding net body 30, the shielding net body 30 has a plurality of mesh holes 31, each mesh hole 31 corresponds to each module channel to allow a corresponding signal transmission module to pass through, the shielding ring sleeve is provided with a ring sleeve segment arranged corresponding to each mesh hole, a shielding contact conductively bonded to a corresponding shielding ring sleeve segment is respectively provided at each mesh hole of the shielding net body, the shielding contact protrudes toward the center of the mesh hole, and a plurality of the shielding contacts corresponding to each mesh hole are circumferentially disposed along the corresponding mesh hole so as to form a fully surrounding arrangement. In this embodiment, the shielding contact is specifically a shielding elastic sheet 32. Herein, the ring sleeve segment is located on the shielding ring sleeve. In fact, if only considering the fitting with the shielding elastic sheets in a fully surrounding arrangement of the shielding net, the shielding ring sleeve segment may be provided only at the position, corresponding to each mesh hole, of the insulator of the signal transmission module to ensure the corresponding conductive abutment with each shielding elastic sheet, and no complete full shielding ring sleeve is needed.

In this embodiment, the mesh hole specifically has a rectangular structure, and the four sides of the rectangular mesh hole are each provided with the shielding elastic sheet. Specifically, four shielding elastic sheets 32 are arranged, the four shielding elastic sheets are in two groups, and each group includes two shielding elastic sheets arranged oppositely. In this embodiment, one group of the shielding elastic sheets includes two first elastic sheets 321 bent toward the same side, and the other group of the shielding elastic sheets comprises two second elastic sheets 322 bent toward the other side. Here, the shielding elastic sheets are bent toward both sides, so that the force applied to the shielding ring sleeve segment can be coordinated. Certainly, all the shielding elastic sheets may also be bent toward the same side.

Certainly, the rectangular mesh hole is used for corresponding to the rectangular signal transmission module, and if the signal transmission module is cylinder-shaped, the mesh hole may also be designed as an annular structure to correspond to the shape of the signal transmission module.

It should be noted that the above-mentioned fully surrounding arrangement refers to a circumferential distribution along the mesh hole. If the mesh hole is annular, the shielding elastic sheets are uniformly distributed at intervals. If the walls of the mesh hole are formed by a plurality of planar walls which are bent and connected in sequence, the shielding elastic sheets may be respectively arranged corresponding to the each planar wall.

Specifically, the shielding net may be a shielding member formed by stamping a metal strip material, and each shielding elastic sheet may be directly formed by stamping. Of course, in other embodiments, the shielding net may also be a shielding member formed by injection molding a conductive plastic or a shielding member formed by injection molding a conductive rubber.

It should be noted that, when in a specific implementation, for the convenience of installation, an elastic snap-fit for positioning and assembling the shielding net in the housing may be provided at the edge of the shielding net body. Of course, other fixed mounting modes, such as elastic barbs, may also be used.

The present utility model further provides an embodiment 1 of the shielding net. As shown in FIGS. 3 and 4, the structure of the shielding net in the embodiment 1 is the same as the structure of the shielding net in the embodiment of the described connector, and related descriptions are omitted herein.

Figure 5:
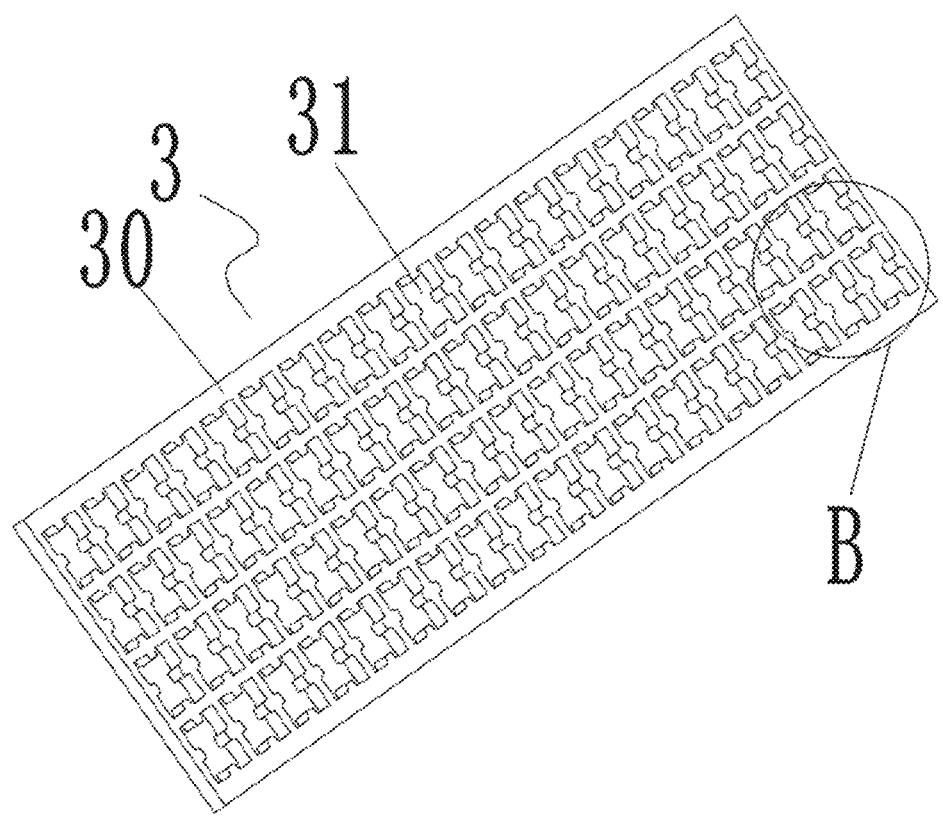
FIG. 5 is a schematic structural view of embodiment 2 of the shielding net provided by the present utility model.
Figure 6:
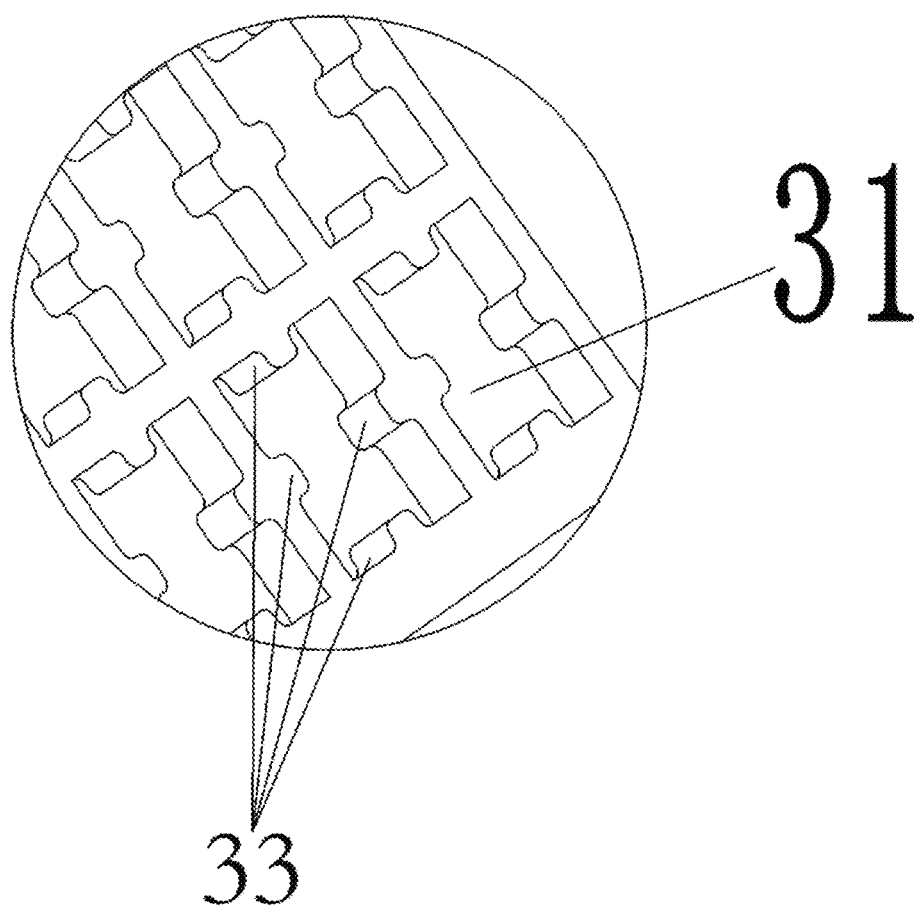
FIG. 6 is an enlarged view at B in FIG. 5.

The present utility model further provides an embodiment 2 of the shielding net. The structure of the shielding net in the embodiment 2 is as shown in FIGS. 5 and 6. The shielding net 3 comprises the shielding net body 30 having corresponding mesh holes 31. The shielding contact 33 conductively bonded to a corresponding shielding ring sleeve segment is respectively provided at each mesh hole of the shielding net body. The shielding contact 33 protrudes toward the center of the mesh hole. A plurality of the shielding contacts 33 corresponding to each mesh hole are arranged in the circumferential direction along the corresponding mesh hole to form a fully surrounding arrangement. The difference between embodiment 2 and embodiment 1 is that: the shielding contacts 33 herein are shaped protrusions which are integrally formed with the shielding net body. In use, the elastic deformation of the shielding net body itself is mainly relied to ensure reliable contact of the signal transmission modules during normal deflection.

Of course, in the present embodiment, the mesh hole is also a rectangular hole, and the four circumferential walls of the rectangular hole are each provided with a corresponding shielding contact. In an embodiment, the mesh hole may also be designed as an annular structure, and at this time, the shielding contacts are uniformly distributed at intervals along the circumferential direction.

The invention claimed is:

1. A shielding net, comprising a shielding net body, the shielding net body having a plurality of mesh holes for allowing corresponding signal transmission modules to pass through, wherein a shielding contact for being conductively bonded to a grounding shielding member of a corresponding signal transmission module is respectively provided at each mesh hole of the shielding net body, the shielding contact protrudes towards the center of the corresponding mesh hole, and a plurality of the shielding contacts corresponding to each mesh hole are circumferentially disposed along the corresponding mesh hole so as to form a fully surrounding arrangement, wherein the mesh hole is rectangular, and four sides of the rectangular mesh hole are each provided with the shielding contact.

2. The shielding net according to claim 1, wherein the shielding contact is a shielding elastic sheet.

3. The shielding net according to claim 2, wherein each of the shielding elastic sheets corresponding to each mesh hole comprises a first elastic sheet bent toward one side of the shielding net body and a second elastic sheet bent toward the other side of the shielding net body.

4. The shielding net according to claim 1, wherein the shielding contact is a shaped protrusion integrally formed with the shielding net body.

5. The shielding net according to claim 1, wherein the shielding net is a shielding member formed by stamping a metal strip material or a shielding member formed by injection molding a conductive plastic or a shielding member formed by injection molding a conductive rubber.

6. A connector, comprising a housing, the housing being provided therein with a plurality of module channels arranged in sequence, wherein each module channel, a signal transmission module is movably assembled in a direction perpendicular to the module channel, the signal transmission module comprises an insulator and a signal contact member arranged in the insulator, the housing is further provided with a shielding net, the shielding net is provided with a plurality of mesh holes corresponding to the various module channels to allow the corresponding signal transmission modules to pass through, the signal transmission module has a shielding ring sleeve segment arranged at a position corresponding to a corresponding mesh hole and sheathed outside the insulator, a shielding contact conductively bonded to the shielding ring sleeve segment of a corresponding signal transmission module is respectively provided at each mesh hole of the shielding net, the shielding contact protrudes towards the center of the corresponding mesh hole, and a plurality of the shielding contacts corresponding to each mesh hole are circumferentially disposed along the corresponding mesh hole so as to form a fully surrounding arrangement, wherein the mesh hole is rectangular, and four sides of the rectangular mesh hole are each provided with the shielding contact.

7. The connector according to claim 6, wherein the shielding contact is a shielding elastic sheet, and each of the shielding elastic sheets corresponding to each mesh hole comprises a first elastic sheet bent toward one side of the shielding net and a second elastic sheet bent toward the other side of the shielding net.

8. The connector according to claim 6, wherein the shielding contact is a shaped protrusion integrally formed with the shielding net.

9. The connector according to claim 6 wherein each of the module channels is provided with a channel port through which the signal contact member of a corresponding signal transmission module extends, a baffle for blocking the signal transmission modules from disengagement is provided in the housing at the position corresponding to the channel ports, and the shielding net is located between the baffle and the various module channels.

* * * * *